(12) United States Patent
Abadeer et al.

(10) Patent No.: US 6,913,965 B2
(45) Date of Patent: Jul. 5, 2005

(54) NON-CONTINUOUS ENCAPSULATION LAYER FOR MIM CAPACITOR

(75) Inventors: Wagdi W. Abadeer, Jericho, VT (US); Eric Adler, Jericho, VT (US); Zhong-Xiang He, Essex Junction, VT (US); Bradley Orner, Colchester, VT (US); Vidhya Ramachandran, Colchester, VT (US); Barbara A. Waterhouse, Richmond, VT (US); Michael Zierak, Essex Junction, VT (US)

(73) Assignee: International Busniess Machines Corporation, Armonk, NY (US)

( * ) Notice: Subject to any disclaimer, the term of this patent is extended or adjusted under 35 U.S.C. 154(b) by 0 days.

(21) Appl. No.: 10/709,133

(22) Filed: Apr. 15, 2004

(65) Prior Publication Data

US 2004/0251514 A1 Dec. 16, 2004

Related U.S. Application Data

(60) Provisional application No. 60/320,264, filed on Jun. 12, 2003.

(51) Int. Cl.⁷ .......................................... H01L 21/8242
(52) U.S. Cl. ...................... 438/239; 438/238; 438/386; 438/399; 438/250; 438/393; 257/532; 257/535; 257/296; 257/300

(58) Field of Search .................................. 257/532, 535, 257/296, 300; 438/957, 238, 239, 386, 399, 250, 393

(56) References Cited

U.S. PATENT DOCUMENTS

| 6,144,051 A | * 11/2000 | Nishimura et al. .......... 257/277 |
| 6,284,590 B1 | 9/2001 | Cha et al. .................... 438/240 |
| 6,319,767 B1 | 11/2001 | Cha et al. .................... 438/250 |
| 6,344,964 B1 | 2/2002 | Adler ........................ 361/306.3 |
| 6,430,028 B1 | 8/2002 | Kar-Roy et al. .......... 361/306.3 |
| 2002/0068431 A1 | 6/2002 | Petrarca et al. ............. 438/622 |
| 2003/0027386 A1 | 2/2003 | Lee ............................ 438/253 |

* cited by examiner

*Primary Examiner*—Nathan J. Flynn
*Assistant Examiner*—Scott R Wilson
(74) *Attorney, Agent, or Firm*—Anthony J. Canale

(57) ABSTRACT

The present invention relates to metal-insulator-metal (MIM) capacitors and field effect transistors (FETs) formed on a semiconductor substrate. The FETs are formed in Front End of Line (FEOL) levels below the MIM capacitors which are formed in upper Back End of Line (BEOL) levels. An insulator layer is selectively formed to encapsulate at least a top plate of the MIM capacitor to protect the MIM capacitor from damage due to process steps such as, for example, reactive ion etching. By selective formation of the insulator layer on the MIM capacitor, openings in the inter-level dielectric layers are provided so that hydrogen and/or deuterium diffusion to the FETs can occur.

9 Claims, 2 Drawing Sheets

NON-CONTINUOUS ENCAPSULATION LAYER FOR MIM CAPACITOR

CROSS REFERENCE TO RELATED APPLICATIONS

This application is a non-provisional application of provisional application Ser. No. 60/320,264, "Method of Metal-Insulator-Metal (MIM) Capacitor Fabrication", filed Jun. 12, 2003, and incorporated in its entirety herein by reference.

BACKGROUND OF INVENTION

1. Field of the Invention

The invention relates generally to semiconductors and, more particularly, to metal-insulator-metal (MIM) capacitors for integrated circuits.

1. Background of the Invention

The integration of MIM capacitors and field effect transistors (FETs) on an integrated circuit are important because analog circuits usually require precision capacitors as well as transistors. The on-chip integration of MIM capacitors, FETs, and other devices reduces the cost associated with fabricating integrated circuits.

Semiconductor capacitors are prone to dielectric damage during fabrication that lead to reliability fails due to dielectric breakdown. For example, a MIM capacitor can have a reliability sensitivity to the etch of the inter-level dielectric (ILD) for the vias used to contact the top plate of the MIM capacitor. The integration of high performance inductors with MIM capacitors on a semiconductor chip is done in part with relatively large, tall vias in the inter-level dielectric above the MIM capacitor, which results in prolonged exposure of the MIM capacitor to the via etch.

To reduce the exposure of the top plate to the prolonged via etch, an insulator layer such as, for example, silicon nitride, is formed covering the entire substrate including the top plate of the capacitor and the inter-level dielectric. Referring to FIG. 1, a substrate 10 is provided upon which front-end-of-line (FEOL) levels 20 including semiconductor structures such as, for example, FETs (not shown) and inter-level dielectric layer 25 are formed. Back-end-of-line levels 30 are subsequently formed upon the FEOL levels 20, and include semiconductor structures such as, for example, interconnect 35 and MIM capacitor 40. Conventionally, MIM capacitor 40 is formed on inter-level dielectric layer 25 by depositing a bottom metal layer 45, a portion of which forms a bottom metal plate of the MIM capacitor and another portion of which forms an electrical contact area, depositing a dielectric layer 50 on the bottom metal layer 45, and depositing on the dielectric layer 50 a top metal layer 55, a portion of which forms a top metal plate of the MIM capacitor and another portion of which forms an electrical contact area. Over the MIM capacitor, an insulator layer 60 is deposited to cover inter-level dielectric 25, interconnect 35 and MIM capacitor 40. Processing continues with a deposition to form inter-level dielectric 65 and a reactive ion etch to form via 70. The insulator layer 60 acts as an etch stop for the MIM capacitor top plate 55 to prevent exposure to the via etch, thus preventing breakdown of the MIM capacitor dielectric.

Although reliability of the capacitor dielectric is improved in conventional MIM capacitor fabrication, it has been observed that the performance of FETs formed on FEOL levels 20 below the insulator layer 60 are degraded. The formation of a MIM capacitor with reduced sensitivity to dielectric damage without degrading the performance of FETs is desired.

SUMMARY OF INVENTION

It is thus an object of the present invention to provide MIM capacitors with reduced sensitivity to dielectric damage without degrading the performance of FETs in an integrated circuit.

The foregoing and other objects of the invention are realized, in a first aspect, by a semiconductor structure comprising:

a substrate comprising a plurality of levels formed thereupon;

a metal-insulator-metal (MIM) capacitor formed on an inter-level dielectric layer in a first of the plurality of levels; and an insulator layer selectively formed on said MIM capacitor, wherein portions of the inter-level dielectric layer are insulator layer-free.

Another aspect of the invention is a method of forming a semiconductor structure comprising the steps of:

providing a substrate comprising a plurality of levels formed thereupon;

forming a metal-insulator-metal (MIM) capacitor on an inter-level dielectric layer in a first of the plurality of levels; and selectively forming an insulator layer on said MIM capacitor, wherein portions of the inter-level dielectric layer are insulator layer-free.

A further aspect of the invention is an integrated circuit comprising:

a substrate comprising a lower level including a plurality of field effect transistors and an upper level;

a metal-insulator-metal (MIM) capacitor formed on an inter-level dielectric layer in the upper level; and a silicon nitride layer selectively encapsulating a portion of the MIM capacitor, wherein portions of the inter-level dielectric layer are silicon nitride layer-free, said silicon nitride layer-free portions allow hydrogen and/or deuterium to diffuse to the FETs.

BRIEF DESCRIPTION OF DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION

With the integration of MIM capacitors and FETs on integrated circuit chips, MIM capacitor processing is typically performed in BEOL levels subsequent to FET processing in FEOL levels and, as such, the effect of MIM capacitor processing is not expected to have an effect on FET performance. The inventors have observed that when MIM capacitors and FETs are formed by conventional means such as was described with reference to FIG. 1, the performance of the FETs degraded. For example, it was observed that an increase in threshold voltage shift over time occurred in FETs which were integrated with MIM capacitors in an integrated circuit.

It was determined that the shift in threshold voltage was related to the out-diffusion of hydrogen or deuterium from the channel regions of the FETs when MIM capacitors and FETs are formed in an integrated circuit chip. Without the integration of MIM capacitors, FETs formed in FEOL levels are exposed to subsequent processing steps such as, for example, a high temperature anneal in a BEOL level which results in hydrogen or deuterium diffusing through inter-level dielectrics to the FETs. Hydrogen or deuterium which diffuses out of the channel regions of the FETs is replaced by hydrogen or deuterium supplied from the ambient atmosphere (i.e. high temperature anneal). Thus, threshold voltage shifts are avoided since the channel regions of the FETs are not depleted of hydrogen or deuterium.

Figure 1:
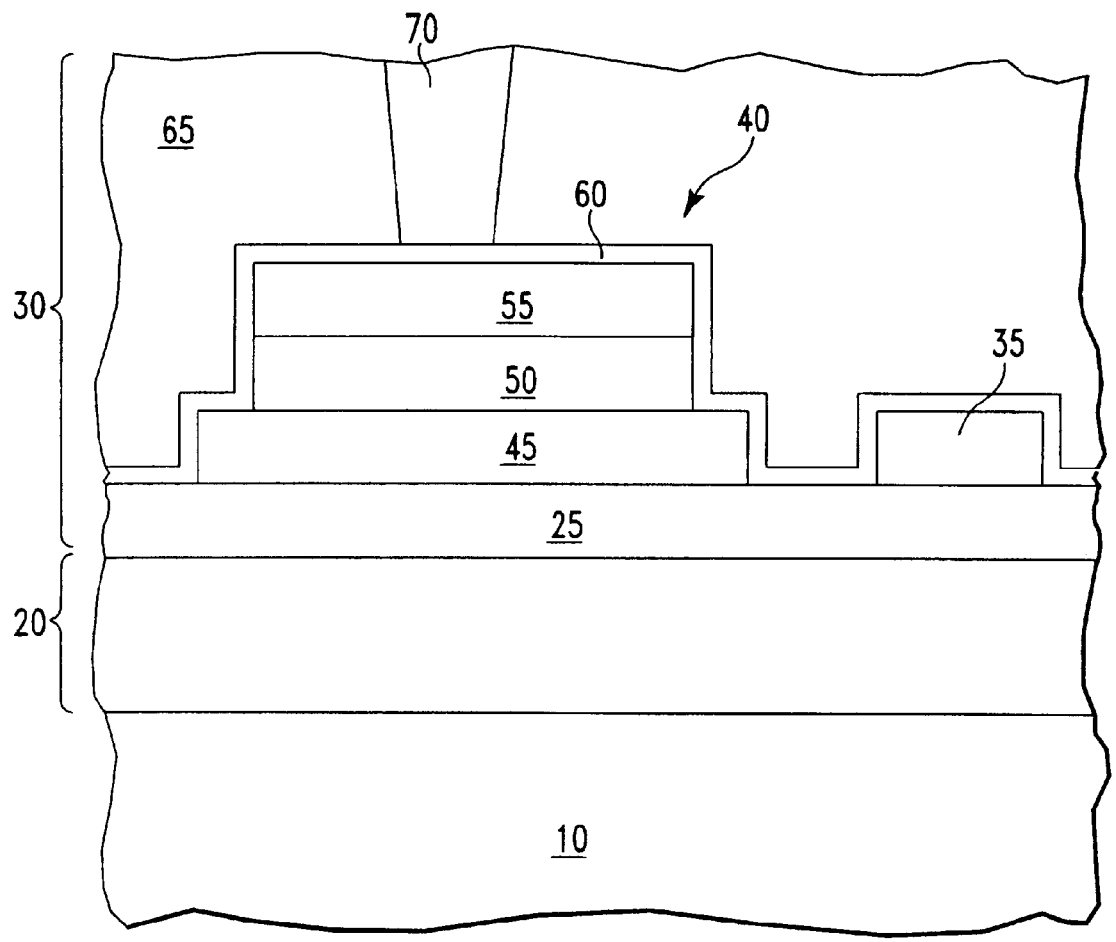
FIG. 1 illustrates a conventional MIM capacitor.

For MIM capacitors formed according to conventional techniques as described with reference to FIG. 1, it has been determined that the etch stop layer (i.e. insulator layer 60) has an effect on the diffusion of hydrogen or deuterium from the ambient atmosphere to the FETs. For example, it has been determined that silicon nitride etch stop layer 60 formed over the entire substrate is a barrier to ambient hydrogen or deuterium diffusion during subsequent anneals. Hydrogen or deuterium is not able to diffuse from the ambient atmosphere to the channel regions of the FETs to replace hydrogen or deuterium which diffuses out of the FET channel regions. The out-diffusion of hydrogen or deuterium causes a loss of passivation in the channel regions, leading to an increase in threshold voltage shift over time due to hot-electron effects.

The invention relates to forming MIM capacitors on BEOL levels without degrading the performance of FETs formed on FEOL levels by providing a path for diffusion of hydrogen and/or deuterium from the BEOL levels to the FETs. This is accomplished by selective formation of an insulator layer on the MIM capacitors. A portion of the insulator layer is selectively removed from an inter-level dielectric layer such that ambient hydrogen and/or deuterium may diffuse to the FETs while another portion of the insulator layer remains on the MIM capacitors to prevent damage to the capacitor dielectric caused by etch processes.

Figure 2A:
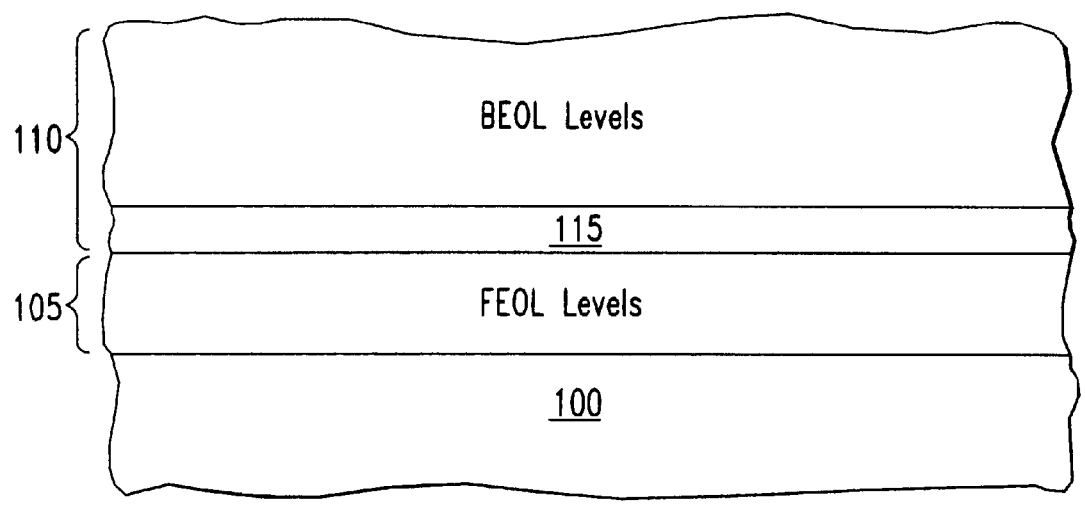
FIGS. 2A–E show a MIM capacitor formed according to an embodiment of the invention.

Referring to FIG. 2A, a substrate 100 is provided upon which FEOL levels 105 are formed by methods known to those skilled in the art. Substrate 100 can be selected from materials such as, for example, silicon or silicon-on-insulator (SOI). FEOL levels 105 comprise semiconductor structures such as, for example, FETs, interconnects and isolation regions (not shown). BEOL levels 110 are subsequently formed upon the FEOL levels 105, and include semiconductor structures such as, for example, inter-level dielectric (ILD) layer 115, and interconnects and MIM capacitors (described hereinafter with reference to FIG. 2B). ILD layer 115 can be formed of known a dielectric material such as, for example, silicon oxide or a low-k dielectric such as SILK (available from Dow Chemical Co., Midland, Mich.).

Figure 2B:
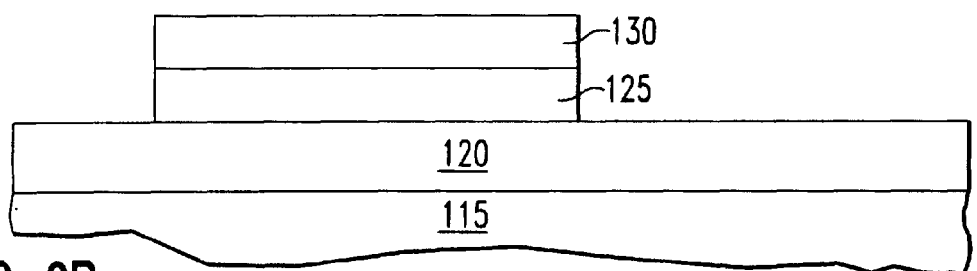

FIGS. 2B–E show the formation of a MIM capacitor according to the invention. FIG. 2B shows a lower metal layer 120 such as, for example, a layer of aluminum is formed on ILD layer 115 by methods known in the art such as, for example, chemical vapor deposition or physical vapor deposition. Aluminum layer 120 is subsequently patterned and etched as described hereinafter to provide the bottom plate of a MIM capacitor and interconnects. A capacitor dielectric 125 such as, for example, silicon oxide or silicon nitride is formed on aluminum layer 120. A top metal plate 130 such as, for example, titanium nitride (TiN) is formed on the capacitor dielectric 125. The capacitor dielectric 125 and the top metal plate 130 are defined using, for example, known photolithographic and etch processes.

Figure 2C:
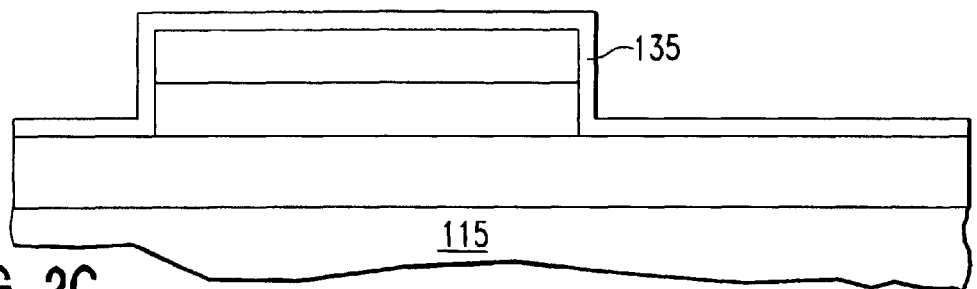

An insulator layer 135 is then formed as shown in FIG. 2C using a known process such as, for example, chemical vapor deposition, sputter deposition or physical vapor deposition. Insulator layer 135 comprises a material which has a lower etch rate than ILD layer 115 during a subsequent via etch process. For example, when an oxide ILD layer 115 is utilized, a preferred material for use as insulator layer 135 is silicon nitride.

Figure 2D:
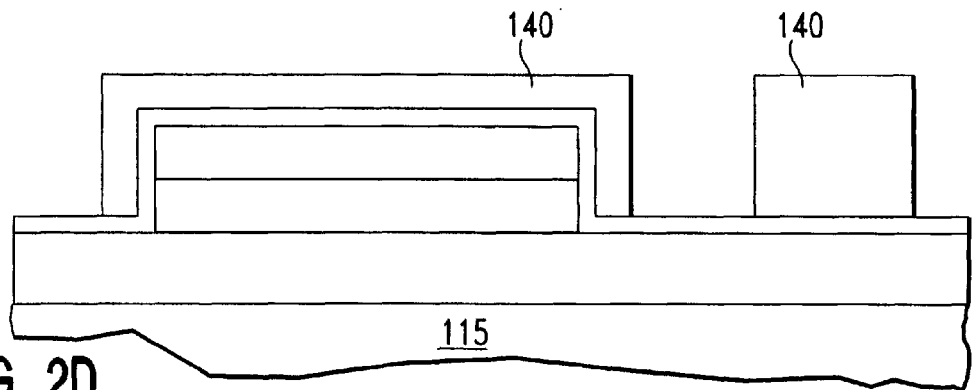
Figure 2E:
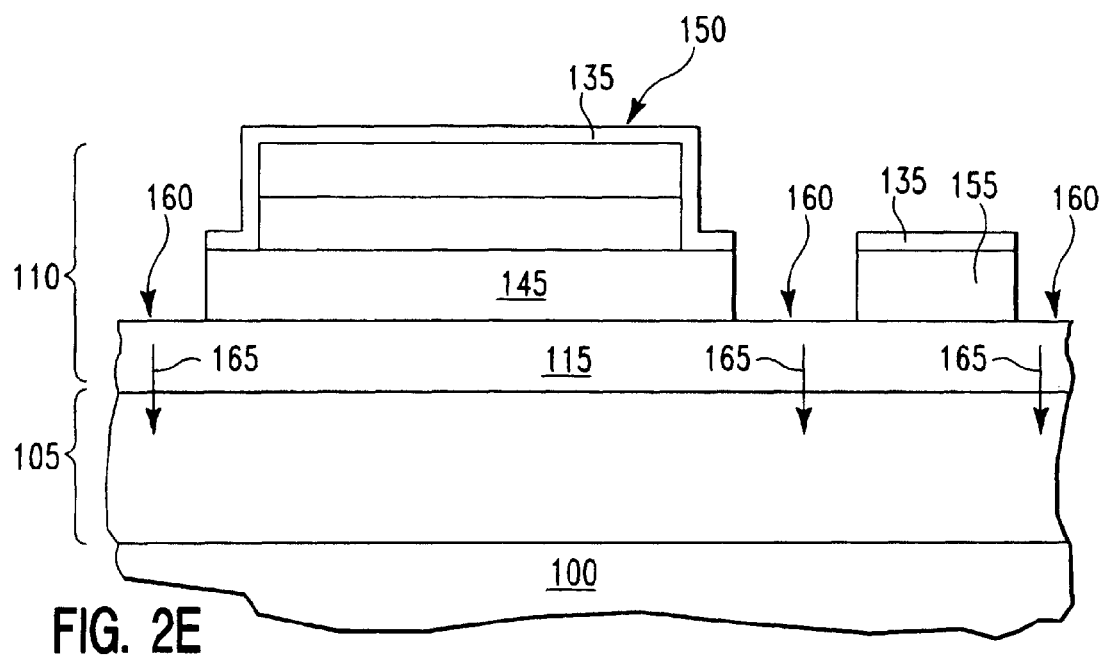

Referring to FIG. 2D, a photoresist layer 140 is patterned using known photolithographic processes. Exposed portions of aluminum layer 120 and silicon nitride layer 135 are removed by known etch processes such as, for example, a reactive ion etching to form the bottom plate 145 of MIM capacitor 150 and interconnects 155 as shown in FIG. 2E. Silicon nitride layer 135 encapsulates a portion of MIM capacitor 150 including capacitor dielectric 125 and top metal plate 130, and also remains on the upper surface of the interconnects 155, which is of no consequence. However, the silicon nitride layer 135 is removed from all other regions of the substrate resulting in openings 160 which are permeable to hydrogen and/or deuterium diffusion. Processing continues with a subsequent inter-level dielectric deposition and formation of via studs in the ILD level (not shown). The silicon nitride layer 135 acts as an etch stop for the top metal plate 130 to prevent exposure of the top metal plate 130 to the via etch.

By selectively forming openings 160 during MIM capacitor 150 processing in the BEOL levels 110 according to the invention, ambient hydrogen and/or deuterium can diffuse through diffusion paths 165 to FETs formed on FEOL levels 105, and the silicon nitride layer 135 remains on the top plate 130 of the MIM capacitors 150 to prevent damage to capacitor dielectric 125 due to etch processes which are exposed to MIM capacitors 150.

For integrated circuit design rules that limit the maximum metal density to, for example, about 70%, at least about 30% of the substrate would include openings 160 which would be permeable to hydrogen and/or deuterium diffusion. The inventors have observed that the performance of FETs improved by incorporating openings 160 in integrated circuits including MIM capacitors and FETs. The invention provides reliable MIM capacitors without degrading the performance of FETs.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A method of forming a semiconductor structure comprising the steps of:

providing a substrate comprising a plurality of levels formed thereupon;

forming a metal-insulator-metal (MIM) capacitor on an inter-level dielectric layer in a first of the plurality of levels;

forming an insulator layer on said MIM capacitor and exposed portions of the inter-level dielectric layer;

patterning a masking layer on said insulator layer; and removing exposed portions of said insulator layer and a bottom plate of said MIM capacitor, wherein portions of the inter-level dielectric layer are insulator layer-free.

2. The method of claim 1, wherein said MIM capacitor comprises a bottom metal plate adjacent the inter-level dielectric layer, a capacitor dielectric layer on the bottom metal plate and a top plate on the capacitor dielectric layer.

3. The method of claim 1, wherein said step of forming said insulator layer comprises chemical vapor deposition.

4. The method of claim 1, wherein said removing step comprises reactive ion etching.

5. The method of claim 1, wherein edge portions of said insulator layer are self-aligned to respective edge portions of the bottom metal plate.

6. The method of claim 1, wherein said insulator layer encapsulates the top metal plate and the capacitor dielectric layer.

7. The method of claim 1, wherein said insulator layer comprises silicon nitride.

8. The method of claim 1, wherein the inter-level dielectric layer comprises silicon oxide.

9. The method of claim 1, wherein a second of the plurality of levels is located between an upper surface of the substrate and the first of the plurality of levels, the second of the plurality of levels comprises a field effect transistor (FET) formed thereupon, and said portions provide a path for diffusion of hydrogen and/or deuterium to the FET.

* * * * *